United States Patent [19]

Oppelt et al.

[11] Patent Number: 4,951,012
[45] Date of Patent: Aug. 21, 1990

[54] TRANSFORMER ARRANGEMENT TO ACCOMPLISH IMPEDANCE TRANSFORMATION

[75] Inventors: Ralph Oppelt, Weiher; Markus Vester, Erlangen, both of Fed. Rep. of Germany

[73] Assignee: Siemens Aktiengesellschaft, Berlin and Munich, Fed. Rep. of Germany

[21] Appl. No.: 333,286

[22] Filed: Apr. 5, 1989

[30] Foreign Application Priority Data

Apr. 11, 1988 [DE] Fed. Rep. of Germany ....... 3811985

[51] Int. Cl.$^5$ ............................................. H01P 5/02
[52] U.S. Cl. ...................................... 333/33; 333/246; 336/200
[58] Field of Search ................... 333/131, 32, 33, 246; 336/200

[56] References Cited

U.S. PATENT DOCUMENTS

| | | | |
|---|---|---|---|
| 3,106,688 | 10/1963 | Johnson | 333/32 X |
| 3,882,432 | 5/1975 | Bowman et al. | 333/32 |
| 4,494,100 | 1/1985 | Stengel et al. | 336/200 |
| 4,839,616 | 6/1989 | Herzog | 333/32 |

Primary Examiner—Paul Gensler
Attorney, Agent, or Firm—Hill, Van Santen, Steadman & Simpson

[57] ABSTRACT

An impedance transformation comprising a plurality of elementary tranformers which can be used as impedance converters for radio frequency antennas of a nuclear magnetic resonant tomograph system. At least one combination of a parallel circuit and a series circuit using inner conductors and the outer conductors exists at the primary side of the transformer and at the secondary side of the elementary transformers. Nearly all arbitrary transformation ratios can be obtained with the line transformers of the invention.

10 Claims, 3 Drawing Sheets

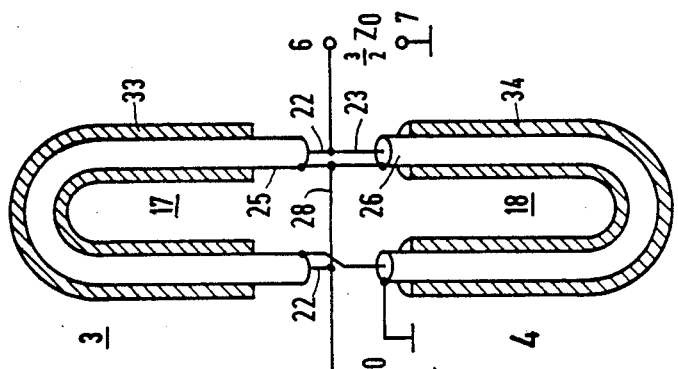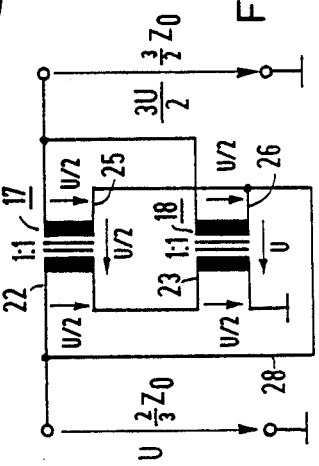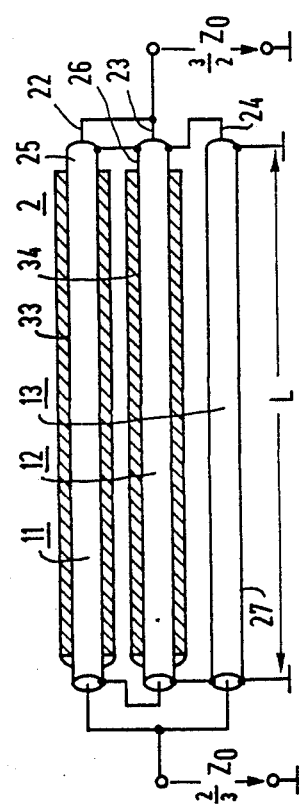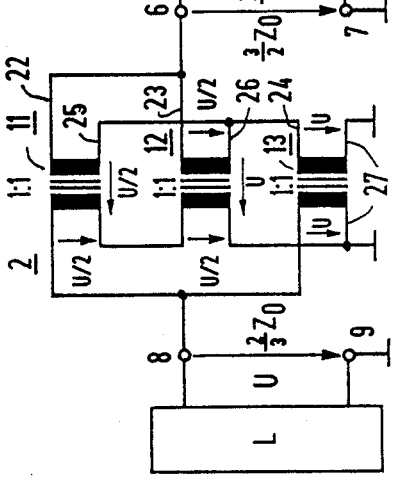

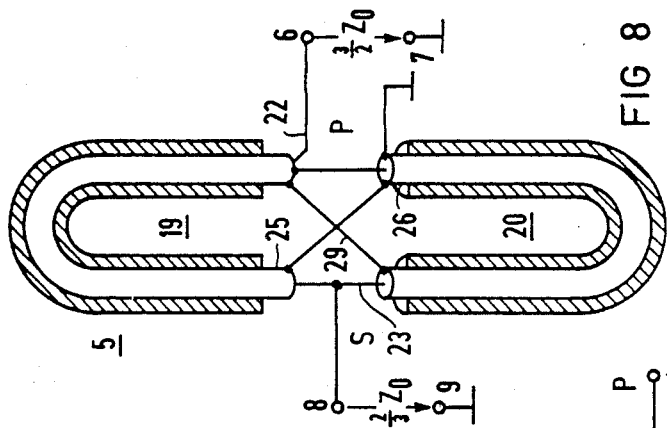
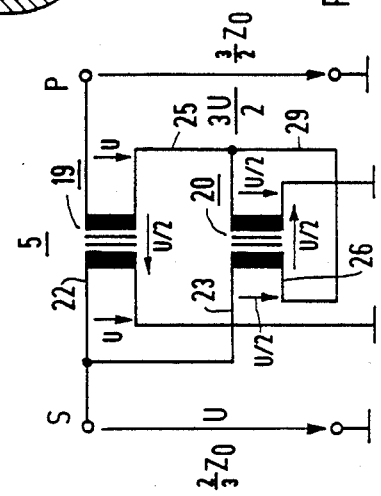
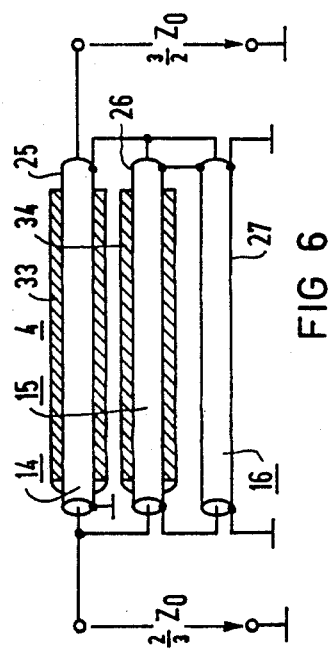
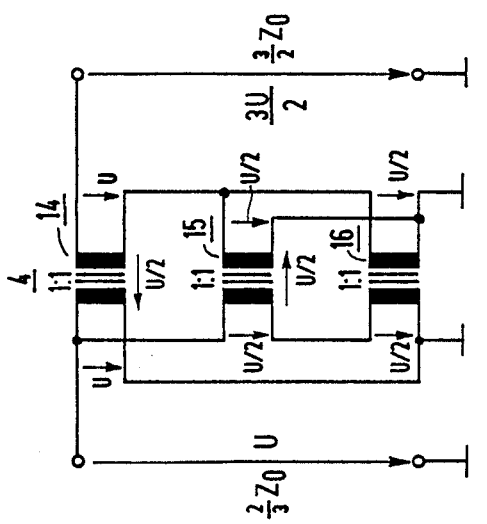

TRANSFORMER ARRANGEMENT TO ACCOMPLISH IMPEDANCE TRANSFORMATION

BACKGROUND OF THE INVENTION

1. Field of the Invention

This invention relates to an arrangement of a plurality of elementary transformers for impedance transformation which can be used as line transformers.

2. Description of the Related Art

In radio frequency technology, line transformers are used for broadband matching of two impedances which have a ratio of 1:2, for example, for matching two 50 ohm radio antennas which are connected in parallel to a 50 ohm transmitter and particularly for matching two transmission and reception antenna systems of a nuclear magnetic resonant tomograph system to one transmitter or, respectively, to one receiver. An arrangement of elementary transformers is provided for impedance matching so as to achieve an adequate bandwidth and obtain low transit losses.

Transformers suitable for the range of low frequency alternating current generally contain a core of magnetic material as well as a primary winding and a secondary winding each of which has at least a few turns. The quadrapole that is thus formed should modify current and voltage in the desired manner so as to accomplish an impedance transformation. Such transformers are suitable for impedance transformation as long as the length of the conductor forming one winding is short relative to the wavelength. As is well known, radio antennas should also transmit electromagnetic energy such as arbitrary signals which are undistorted and extremely high frequencies also. In broadband transformers, both windings are therefore so tightly coupled that they form lines having defined characteristic or image impedance and negligible radiation losses. In a practical manner, any rational transformer ratio can be realized with line transformers. A transformation ratio of 3:2 is obtained, for example, using five elementary transformers which have a transformer ratio of 1:1 with the first two transformers connected in parallel on the primary side and are secondarily connected in series. A voltage ratio of 1:2 is thus obtained. The three additional elementary transformers are connected in series on the primary side and are secondarily connected in parallel. A voltage transformation of 3:1 is thus obtained and a total transformation of 3:2. So as to obtain a transformation ratio of, for example, N:M however, the sum of N+M transformers has always been required as discussed in the publication NTZ 1966, No. 9, Pages 527–538. See also U.S. Pat. No. 4,095,163, U.S. Pat. No. 3,370,257, U.S. Pat. No. 3,428,886, British Patent No. 1,599,557, British Patent No. 2,161,940 and European Patent No. 129,464.

SUMMARY OF THE INVENTION

It is an object of the present invention to simplify the prior art known arrangement for impedance transformation using line transformers.

It is known that an impedance transformer for an impedance ratio of 1:2 requires a voltage transformation $\ddot{U}=1:\sqrt{2}$. In practice, it is generally adequate to approximate this transformation ratio using a rational transformation ratio. A relatively good approximation of $\ddot{U}=5:7=1:1.4$ can be realized with prior art arrangement using elementary transformers. However, this requires the use of at least 12 elementary transformers.

The invention is based on the realization that the simple approximation of $\ddot{U}_2=2:3=1:1.5$ generally is adequate. From this it can be derived that an impedance transformation of $\ddot{U}_2=2.25$ and a maximum amount of reflection factor of $|r|=|(2.25-2)/(2.25+2)|\approx 0.059$ can be obtained. It follows from this that $1-|r|^2=99.65\%$. The transmitted active power is thus only 0.35% less than the active power which is fed in. The invention is based on this realization that elementary transformers can be arranged in the primary and/or secondary to obtain an impedance transformation of $U_2=1:2.25$.

For example, an impedance transformation of 2.25:1 and a voltage transformation of 1.5:1 is obtained using three elementary transformers wherein the first two primary windings are connected in parallel and these two windings are connected in series with the third primary winding.

In a simplified embodiment comprising two elementary transformers, the primary windings can be connected in parallel and the secondary windings can be connected in series. The ends of the primary winding are then connected to the start of the first secondary winding.

Also, three elementary transformers can be provided which have their first primary winding connected in series with the parallel circuit composed of the second and third primary windings. The first secondary winding is connected in parallel to the series circuit comprising the second and third secondary windings. This embodiment can be simplified by using two elementary transformers that are connected in series on the primary side and wherein the starting windings of the two secondary windings are connected to each other. In this embodiment, the connection of the two primary windings is then connected to the end of the second secondary winding. A line transformer which has an impedance transformation of 3/2 $Z_0$ to 2/3 $Z_0$ or, respectively, a voltage transformation of 3/2 U to U is obtained with these embodiments using a small number of transformers and at small cost.

In these embodiments, the conductors of the individual elementary transformers area all of equal length and all have the same characteristic or image impedance $Z_0$. It is assured that the elementary transformers are decoupled in terms of radio frequency using inductive loading. With identical lengths of the conductors of the elementary transformers, the identical transit time results for all signal paths and thus practically there is no upper limit frequency for the line transformers in the embodiments without line connections between the primary and secondary side.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure, and in which:

BRIEF DESCRIPTION OF THE DRAWINGS

FIG. 1 is a schematic view showing the low frequency equivalent circuit diagram of a line transformer according to the invention;

FIG. 2 is a partially sectional view snowing a practical embodiment of the transformer of FIG. 1;

FIG. 3 illustrates a simplified embodiment as a low frequency equivalent circuit diagram;

FIG. 4 illustrates the practical embodiment of the line transformer illustrated in FIG. 3;

FIG. 5 shows an additional embodiment is a low frequency equivalent circuit diagram;

FIG. 6 shows the practical embodiment of the arrangement of FIG. 5;

FIG. 7 shows a simplified embodiment of the arrangement of FIG. 5;

FIG. 8 illustrates the practical embodiment of the transformer of FIG. 7;

DESCRIPTION OF THE PREFERRED EMBODIMENTS

Figure 9:
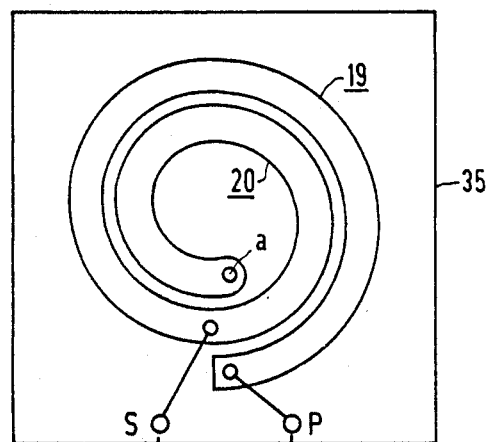
FIG. 9 is a plan view of the line transformer formed in symmetrical strip line.

FIG. 1 illustrates an embodiment of the invention for impedance transformation and comprises a low frequency equivalent circuit diagram for purposes of simplification. A line transformer 2 comprises three elementary transformers 11, 12 and 13 each of which has a voltage transformation ratio of 1:1. A transmitter S which has an output voltage of, for example, $3/2U = 500$ V is connected to the input terminals 6 and 7 of the primary winding of the line transformer 2. A load L is connected to the output terminals 8 and 9. The input terminal 7 and the output terminal 9 are connected to ground. The primary windings of the elementary transformers 11 and 12 are connected in parallel and this combination is connected in series with the primary winding of the elementary transformer 13 as shown. The primary windings of the elementary transformers 11 and 12 thus transmit the voltage $U/2$ and the primary winding of the transformer 13 transmits the voltage U. The secondary windings of the transformers 11 and 12 are connected in series and this series combination is connected in parallel with the secondary winding of the transformer 13. On the secondary side, thus, the transformers 11 and 12 each transmit voltages of $U/2$ and the transformer 13 transmits the voltage U so that the overall voltage at the secondary side is U. The cable impedance $Z_0$ of the three elementary transformers 11, 12 and 13 is respectively selected so that the impedance of the primary side is Z which is approximately equal to $3/2\ Z_0$ and the impedance of the secondary side is $Z/2 \approx 2/3\ Z_0$.

FIG. 2 illustrates a practical embodiment of the line transformer 2 wherein the three elementary transformers 11, 12 and 13 are each formed of a coaxial cable. The inner conductors of the elementary transformers 11, 12 and 13 are designated by 22, 23 and 24, respectively. The outer conductor 27 is connected at both ends to ground; thus one terminal of the secondary transformer 13 is connected to ground. Each of the elementary transformers 11 and 12 are provided with inductive loads 33 and 34, respectively, which can be formed of jackets of ferrite material so as to obtain a high inductance with a relatively short line length L. For example, the line length L can be about 10 cm.

The inner and outer conductors are connected as shown in FIG. 2 which corresponds to the connections illustrated and described with relative to FIG. 1.

Since all of the coaxial cables of the elementary transformers 11, 12 and 13 have the identical lengths, all of the signal paths have the same transit times so theoretically the line transformer 2 has no upper frequency limit. In practice, an upper frequency limit occurs due to leakage inductances and stray capacitances at the ends of the lines as well as due to the capacitances of ungrounded outer conductor shieldings 25 and 26 to ground. A lower frequency limit is determined by the finite inductive loads 33 and 34 of the elementary transformers 11 and 12 since with a decreasing frequency, the condition that the inductive decoupling impedance L must be far greater than the cable length because $Z_0$ is no longer satisfied. The three elementary transformers 11, 12 and 13 each have the impedance of $Z_0$ and transform the overall impedance $3/2\ Z_0$ of the transmitter side to the impedance $2/3\ Z_0$ of the receiver side. The impedance transformation ratio is thus $4:9 = 1:2.25$. In a line transformer according to FIGS. 1 and 2 for matching, for example, the transmitter S which has an impedance of $50\Omega$ can be connected to a radio frequency load L which has an impedance of $25\Omega$ and so-called semi-rigid lines can be used in a simple manner. For example, the load L can be formed of two $50\Omega$ loads connected in parallel or, particularly, two radio antennas connected in parallel.

The inductive loads 33 and 34 each comprise a ferrite jacket in the embodiments of FIGS. 1 and 2. Under certain circumstances, it is expedient to respectively produce one inductive load as a modification of the embodiment illustrated in FIG. 2 by providing that the coaxial cables of the elementary transformers 11 and 12 are respectively wound with one or more turns.

FIG. 3 illustrates a simplified embodiment of a line transformer 3 which comprises the elementary transformers 17 and 18. The elementary transformer 13 of the prior embodiment can be eliminated in that an aligned bridge 28 is produced between the outer conductor 26 of the coaxial cable of the elementary transformer 18 and the inner conductor 22 of the elementary transformer 17. In this embodiment of the line transformer 3, the primary windings of the transformers 17 and 18 are connected in parallel and the secondary windings are connected in series so that the impedance $3/2\ Z_0$ of the transmitter side is transformed to an impedance $2/3\ Z_0$ of the receiver side with a transformation ratio of $3/2\ U/U = 1.5:1$.

FIG. 4 illustrates the practical embodiment of the line transformer 3 and the coaxial cables of the line transformers 17 and 18 which carry inductive loads 33 and 34 are formed by bending them to have U-shapes so that the line connections of the primary and secondary sides lie directly adjacent to each other and only short line connections are required. The input terminal 6 is connected to the first terminals of the inner conductors 22 and 23 as illustrated on the primary side. The two shields or outer conductors 25 and 26 are connected together and to the output terminal 8 by using the line bridge 28 which is also connected to the inner connector 22 as shown in FIG. 4. The direct line bridge or conductor 28 will have an unequal transit time from the primary side to the secondary side, but this slight phase error is not noticeable until extremely high frequencies in the order of several hundreds MHz are reached.

FIG. 5 illustrates an arrangement for impedance transformation comprising a line transformer 4 that contains three elementary transformers 14, 15 and 16 wherein an impedance of $3/2\ Z_0$ at the primary side is transformed to $2/3\ Z_0$ at the secondary side. The voltage $3/2\ U$ at the transmitter side is converted into U at the secondary side. The primary winding of the elementary transformer 14 is connected in series with the combination of a parallel circuit comprising the primary windings of the elementary transformers 15 and 16 as shown. On the secondary side, the secondary winding of the elementary transformer 14 is connected in parallel with the series combination comprising the secondary windings of the transformers 15 and 16 as shown.

FIG. 6 illustrates a practical embodiment of the line transformer 4 illustrated in FIG. 5 wherein the outer conductors or shields 25 and 26 of the elementary transformers 14 and 15 are provided with inductive loads 33 and 34, respectively. The outer conductors 26 and 27 of the elementary transformers 15 and 16 are connected to ground at the primary side.

As indicated by the arrows which indicate voltage under the elementary transformers 14 and 15 in FIG. 5, only the respective voltage U/2 drops off at the outer conductors of the two coaxial cables. In this embodiment, therefore, a lower frequency limit which is lower by a factor of 2 is obtained with the same inductive loads 33 and 34 than that which was obtained in the embodiments of FIGS. 1–4. Thus, the embodiment of FIGS. 5 and 6 has a relatively greater bandwidth.

FIG. 7 illustrates a simplified version of a line transformer 5 for impedance transformation of 3/2 $Z_0$ at the primary side P to 2/3 $Z_0$ at the secondary side S and two elementary transformers 19 and 20 are connected as shown to provide a low frequency equivalent circuit. The primary windings of the elementary transformers 19 and 20 are connected in series between input terminal P and ground and the terminals 22 and 23 of the secondary windings are connected to each other. The secondary side S of the elementary transformer 20 is connected by using a line bridge 29 to the connection of the two primary windings of the line transformers 19 and 20 as shown. The voltage U/2 indicated by arrows in FIG. 7 respectively drops off at the outer conductors or shields 25 and 26 of the corresponding coaxial cables of the elementary transformers 19 and 20. Thus, this embodiment has a greater bandwidth than the embodiments illustrated in FIGS. 1–4.

FIG. 8 illustrates a practical embodiment of the line transformer 5 of FIG. 7 wherein two coaxial cables of the elementary transformers 19 and 20 are each formed by bending into a U-shape so that the ends are close to each other. The inner conductors 22 and 23 are connected to the output terminal 8 as shown. The line 29 connects the outer shield or conductor 26 of the elementary transformer 20 to the outer shield or conductor 25 of the elementary transformer 19. The outer conductor or shield 26 is at ground on the primary side P. In this embodiment, the line transformer 5 transforms an impedance of 3/2 $Z_0$ at the primary side P to 2/3 $Z_0$ at the second side S with an upper frequency limit which is somewhat lower than the other embodiments, but which however is in the region of several hundred MHz.

Commercially available coaxial cables can be utilized in the embodiments of the line transformers according to the exemplary embodiments illustrated in FIGS. 2, 4, 6 and 8.

Also, under certain circumstances, it may be desirable to employ symmetrical two-wire lines instead of coaxial cables in the invention.

It is also possible to produce the line transformers by etching using symmetrical strip lines and, as necessary to omit the use of a ferrite jacket for inductive loading.

When a line transformer is formed of a plurality of elementary transformers, then the number of turns, the orientation and arrangement of the lines of the individual elementary transformers can be selected so that the magnetic flux is superimposed and this in turn intensifies the desired inductive effect (as described in NTZ 1966, No. 9, pages 527 through 538). In a line transformer according to FIG. 7, the same voltage U/2 respectively drops off along the line of the two elementary transformers 19 and 20. When these lines are arranged in a tight juxtaposition so as to superimpose the magnetic fluxes, then the same number of turns must be selected.

Figure 10:
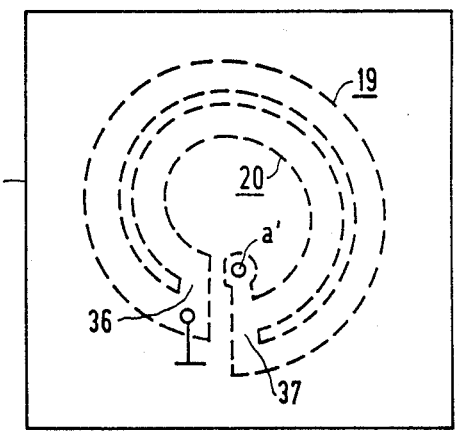
FIG. 10 is a plan view of the underside of the device.

A special embodiment of the line transformer can be formed where at least one line of the line transformers 11 through 20 is executed as a symmetrical strip line. For example, an embodiment of the line transformer shown in FIG. 7 in strip line technology is shown in FIGS. 9 and 10 which uses the aforementioned flux superimposition. As shown in FIG. 9, an interconnect structure is arranged on the upper side of a substrate 35 which serves as dielectric. A nearly identical interconnect structure to that shown in FIG. 9 is arranged on the underside of the substrate 35 as shown in FIG. 10 congruent turns of the spirals are present FIG. 10 is a top view. The conductor structure arranged on the underside is shown by broken lines. Respectively one turn of the conductors on the upper side and underside of the substrate 35 form an elementary transformer composed of a symmetrical strip line which has an impedance $Z_o$, so that a spiral pattern having two turns results for the two elementary transformers 19 and 20. The outer strip line forms the elementary transformer 19 and the inner strip line forms the elementary transformer 20 of FIG. 7. The conductors on the upper side correspond to the inner conductors 22 and 23 and the conductors on the underside correspond to the shieldings 25 and 26 of the coaxial cables of FIG. 8. The connections of the individual start points and the ending points of the conductors on the upper and undersides, for example, the conductor ridges 36 and 37, as well as the through-contact of point a on the upper side to point a' on the underside result from FIG. 8, so that a line transformer having the equivalent circuit diagram of FIG. 7 results.

A production advantage of this embodiment of strip line according to top views of FIGS. 9 and 10 is that no bridging of an conductor is required for the connections.

A further advantage of this embodiment is that the terminal points P and S on the primary side and secondary side can be accessed without a conductor having to be bridged. This enables a low-inductance connection to the other component which are not shown in FIGS. 9 and 10. For example, the line transformer can be directly integrated into radio-frequency circuits having standard, asymmetrical strip lines, without conductor bridges.

In order to optimize the transient response in the region of the upper limit frequency, it is also possible to move the terminal point S of the secondary side on the spiral of the upper side somewhat in the direction toward the terminal point P. Together with known networks composed of series capacitances and shunt capacitances for improving the matching at the input and output, a large bandwidth of at least one decade, for example, from 20 through 200 MHz, can be achieved with an arrangement according to FIGS. 9 and 10 even without using loading of ferrite material.

Figure 11:
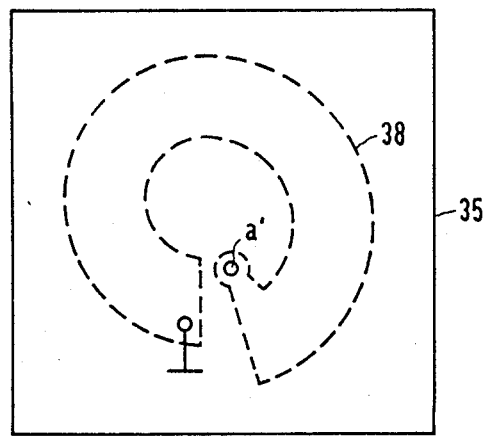
FIG. 11 is a plan view of a modified form.

As a consequence of the conductor ridges 36 and 37, the conductors of both elementary transformers 19 and 20 located on the underside have the same potential along the entire extent of the winding, as shown in FIGS. 9 and 10. They can therefore be preferably connected to one another along the entire length of the winding, so that a single, correspondingly broad conductor 38 remains on the underside, as shown in FIG. 11. This has the advantage that the coupling of the strip lines of both elementary transformers to one another results in close coupling and, thus, the inductance of the windings of the strip lines is further increased.

Although the invention has been described with respect to preferred embodiments, it is not to be so limited as changes and modifications can be made which are within the full intended scope of the invention as defined by the appended claims.

We claim as our invention:

1. A line transformer for impedance transformation comprising a plurality of elementary transformers which each have conductors which are all of equal length and all have the same characteristic impedance $Z_0$ and each of which has primary and secondary sides which are connected in at least one combination of a parallel circuit and a series circuit comprising their inner conductors and their outer shielding conductors (parallel connection of 22, 25 to 23, 26 in series with 24, 27 at the primary side, FIGS. 1 and 2) such that at the primary side and at the secondary side of the elementary transformers (11 through 16) that an impedance transformation of $U=1:2.25$ results.

2. A line transformer according to claim 1, wherein three elementary transformers (11 through 13) which have a transformation ratio 1:1 are used, and the primary windings of the first and second elementary transformers (11, 12) are connected in parallel and this combination is connected in series with the primary winding of the third elementary transformer (13); and the secondary windings of the first and second transformers (11, 12) are connected in series and this combination is connected in parallel to the secondary winding of the third transformer (13).

3. A line transformer according to claim 1 wherein three elementary transformers (14 through 16) are used, wherein the primary winding of the first transformer (14) is connected in series with the combination of the parallel connected windings of the second and third transformers (15, 16), and wherein the secondary winding of the first transformer (14) is connected in parallel to the combination of the series circuit of the secondary windings of the second and third transformers (15, 16).

4. A line transformer, according to claim 1, wherein a line connecting bridge (28, 29) extends between the primary and the secondary sides of one of said elementary transformers (17, 18; 19, 20) (FIGS. 3 and 7).

5. A line transformer according to claim 4, wherein two elementary transformers (19, 29) are used and the primary windings are connected in series and the terminals of the secondary windings are connected together, and wherein a line conductor connection extends between the outer conductor (25) of the first elementary transformer, which is formed as a coaxial cable (19) and the inner conductor (23) of the second elementary transformer which is formed as a coaxial cable (20) at the primary side, said line conductor connection comprising a line bridge (29) connected to the outer conductor (26) of the secondary side of the second line transformer (20) which is connected to ground at the primary side.

6. A line transformer for impedance transformation comprising a plurality of elementary transformers which each have conductors which are all of equal length and all have the same characteristic impedance $Z_0$ and each of which has primary and secondary sides which are connected in at least one combination of a parallel circuit and a series circuit comprising their inner conductors and their outer shielding conductors (parallel connection of 22, 25 to 23, 26 in series with 24, 27 at the primary side, FIGS. 1 and 2) such that at the primary side and at the secondary side of the elementary transformers (11 through 16) that an impedance transformation of $U=1:2.25$ results, wherein a one line connecting bridge (28, 29) extends between the primary and the secondary sides of one of said elementary transformers (17, 18; 19, 20) (FIGS. 3 and 7); and wherein two elementary transformers (17, 18) which have a transformation ratio of 1:1 are used each of which are formed as coaxial cables and inductive loads (33, 34) surround the outer conductors of said coaxial cables and wherein the primary windings are located at first ends of said coaxial cables and are connected to parallel and the secondary windings are located at the second ends of said coaxial cables and are connected in series, and wherein the outer conductors (25 and 26) of said coaxial cables are connected to each other at the primary side and are connected by a line conductor bridge (28) to the inner conductor (22) at the secondary side of the first elementary transformer (17).

7. A line transformer according to claim 1 or 4 or 2 or 6 or 3 or 5 wherein each of said elementary transformers is a symmetrical two-wire conductor.

8. A line transformer for impedance transformation comprising a plurality of elementary transformers which each have conductors which are all of equal length and all have the same characteristic impedance $Z_0$ and each of which has primary and secondary sides which are connected in at least one combination of a parallel circuit and a series circuit comprising their inner conductors and their outer shielding conductors (parallel connection of 22, 25 to 23, 26 in series with 24, 27 at the primary side, FIGS. 1 and 2) such that at the primary side and at the secondary side of the elementary transformers (11 through 16) that an impedance transformation of $U=1:2.25$ results; and wherein each of said elementary transformers (11 through 20) is formed as a symmetrical strip line.

9. A line transformer for impedance transformation comprising a plurality of elementary transformers which each have conductors which are all of equal length and all have the same characteristic impedance $Z_0$ and each of which has primary and secondary sides which are connected in at least one combination of a parallel circuit and a series circuit comprising their inner conductors and their outer shielding conductors (parallel connection of 22, 25 to 23, 26 in series with 24, 27 at the primary side, FIGS. 1 and 2) such that at the primary side and at the secondary side of the elementary transformers (11 through 16) that an impedance transformation of $U=1:2.25$ results, wherein a one line connecting bridge (28, 29) extends between the primary and the secondary sides of one of said elementary transformers (17, 18; 19, 20) (FIGS. 3 and 7), wherein two elementary transformers (19, 20) are used and the primary windings are connected in series and the terminals of the secondary windings are connected together, and wherein a line conductor connection extends between the outer conductor (25) of the first elementary transformer, which is formed as a coaxial cable (19) and the inner conductor (23) of the second elementary transformer which is formed as a coaxial cable (20) at the primary side, said line conductor connection comprising a line bridge (29) connected to the outer conductor (26) of the secondary side of the second line transformer (20) which is connected to ground at the primary side, and wherein each of the elementary transformers (19, 20) is formed of a symmetrical strip line whose conductors are arranged opposite one another on the opposite two flat sides of a substrate (35) (FIGS. 9 and 10).

10. A line transformer according to claim 9, wherein the conductors which are arranged at one of the two flat sides of the substrate (35) have the same potential along the entire extent of the winding and are connected to one another to form a common conductor (38) (FIG. 11).

* * * * *